(12) United States Patent
Landau et al.

(10) Patent No.: US 8,253,241 B2
(45) Date of Patent: Aug. 28, 2012

(54) ELECTRONIC MODULE

(75) Inventors: Stefan Landau, Wehrheim (DE); Erwin Huber, Munich (DE); Josef Hoeglauer, Munich (DE); Joachim Mahler, Regensburg (DE); Tino Karczeweski, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 1111 days.

(21) Appl. No.: 12/123,784

(22) Filed: May 20, 2008

(65) Prior Publication Data

US 2009/0289354 A1    Nov. 26, 2009

(51) Int. Cl.
H01L 23/34    (2006.01)
H01L 23/48    (2006.01)
H01L 23/52    (2006.01)
H01L 29/40    (2006.01)

(52) U.S. Cl. . 257/723; 257/725; 257/776; 257/E25.005; 257/E25.01; 257/E25.012

(58) Field of Classification Search .................. 257/686, 257/691, 700, 723, 724, 725, 758, 777, 678, 257/776, E25.005, E25.01, E25.012
See application file for complete search history.

(56) References Cited

U.S. PATENT DOCUMENTS

| | | | | |
|---|---|---|---|---|
| 4,675,717 A | * | 6/1987 | Herrero et al. | 257/777 |
| 4,783,695 A | * | 11/1988 | Eichelberger et al. | 257/668 |
| 5,049,978 A | * | 9/1991 | Bates et al. | 257/686 |
| 5,245,215 A | * | 9/1993 | Sawaya | 257/676 |
| 5,450,288 A | * | 9/1995 | Tanuma et al. | 361/761 |
| 5,497,033 A | * | 3/1996 | Fillion et al. | 257/723 |
| 5,559,363 A | * | 9/1996 | Immorlica, Jr. | 257/664 |
| 6,057,593 A | * | 5/2000 | Iovdalsky et al. | 257/659 |
| 6,259,148 B1 | * | 7/2001 | Bartush et al. | 257/531 |
| 6,365,975 B1 | * | 4/2002 | DiStefano et al. | 257/777 |
| 6,373,705 B1 | | 4/2002 | Koelle et al. | |
| 6,396,148 B1 | * | 5/2002 | Eichelberger et al. | 257/758 |
| 6,495,914 B1 | * | 12/2002 | Sekine et al. | 257/723 |
| 7,199,459 B2 | * | 4/2007 | Pu et al. | 257/686 |
| 7,268,426 B2 | * | 9/2007 | Warner et al. | 257/707 |

(Continued)

FOREIGN PATENT DOCUMENTS

DE    19519538 A1    11/1996

(Continued)

OTHER PUBLICATIONS

"System in Package with Mounted Capacitor for Reduced Parasitic Inductance in Voltage Regulators", T. Hashimoto, et al., Proceedings of the 20th International Symposium on Power Semiconductor Devices and IC's, May 18-22, 2008, Orlando, FL.

(Continued)

*Primary Examiner* — Evan Pert
*Assistant Examiner* — Teresa M. Arroyo
(74) *Attorney, Agent, or Firm* — Dicke, Billig & Czaja, PLLC

(57) ABSTRACT

An electronic module. One embodiment includes a carrier. A first transistor is attached to the carrier. A second transistor is attached to the carrier. A first connection element includes a first planar region. The first connection element electrically connects the first transistor to the carrier. A second connection element includes a second planar region. The second connection element electrically connects the second transistor to the carrier. In one embodiment, a distance between the first planar region and the second planar region is smaller than 100 µm.

20 Claims, 7 Drawing Sheets

U.S. PATENT DOCUMENTS

| | | | |
|---|---|---|---|
| 2004/0061221 A1* | 4/2004 | Schaffer | 257/723 |
| 2004/0104456 A1 | 6/2004 | Duffy et al. | |
| 2005/0140021 A1* | 6/2005 | Wakisaka et al. | 257/777 |
| 2005/0258529 A1* | 11/2005 | Green et al. | 257/686 |
| 2007/0194427 A1* | 8/2007 | Choi et al. | 257/686 |

FOREIGN PATENT DOCUMENTS

| | | |
|---|---|---|
| DE | 19612514 A1 | 5/1997 |
| DE | 10243885 A1 | 4/2004 |
| DE | 10301091 A1 | 7/2004 |
| DE | 102005049978 A1 | 4/2007 |
| DE | 102006012781 A1 | 9/2007 |

OTHER PUBLICATIONS

R2J20602NP Integrated Driver—MOS FET (DrMOS), Renesas, Rev. 1.00, Nov. 20, 2006.

"Advanced Power SiP with Wireless Bonding for Voltage Regulators", T. Hashimoto, et al., Proceedings of the 19th International Symposium on Power Semiconductor Devices & ICs, May 27-30, 2007, Jeju, Korea, IEEE 2007.

* cited by examiner

ELECTRONIC MODULE

BACKGROUND

The invention relates to an electronic module.

An electronic module may include electronic components like transistors, in one embodiment power transistors. In an electronic module heat is generated by the electronic components contained therein. The electronic components or the electrical lines connecting the electronic components may also include a parasitic inductivity.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Electronic modules described in the following embodiments include transistors. The transistors can be any embodiments of transistors like, for example, MOS transistors, field-effect transistors, bipolar transistors, vertical transistors, power transistors, or IGBT transistors.

There are also described embodiments of electronic modules including a carrier. The carrier can be, for example, any form of substrate or support like, for example, a leadframe, a PCB (printed circuit board), or any other board including wiring connections.

The described embodiments of electronic modules also include connection elements, in one embodiment first, second and third connection elements. These connection elements can be any sort of electrically conductive connection element or connection member like, for example, a clip-like element, a bar-like element or a strip-like element, and the connection element can be made of any electrically conductive material like any metallic material. It can also be made of any sort of material which may be partly or fully covered with an electrically conductive material. Different techniques are available to apply the connection elements like, for example, printing, laminating or sticking and the connection elements can have any desired and appropriate form.

Figure 1:
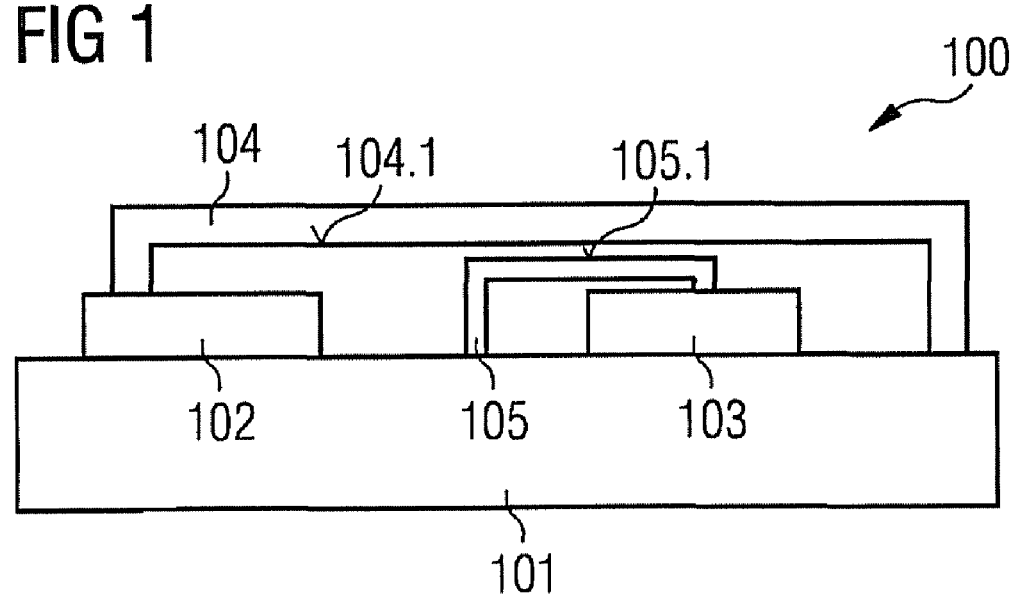
FIG. 1 illustrates a sectional side view of an electronic module according to one embodiment.

FIG. 1 illustrates a sectional side view of a first embodiment of an electronic module 100. The electronic module 100 includes a carrier 101, a first transistor 102 attached to the carrier 101, a second transistor 103 attached to the carrier 101, a first connection element 104 including a first planar region 104.1, and a second connection element 105 including a second planar region 105.1. The first connection element 104 electrically connects the first transistor 102 to the carrier 101, and the second connection element 105 electrically connects the second transistor 103 to the carrier 101. The distance between the first region 104.1 and the second region 105.1 is smaller than 100 μm.

In one embodiment illustrated in FIG. 1 the first region 104.1 of the first connection element 104 is given as a planar surface region of the first connection element 104 and the second region 105.1 of the second connection element 105 is given as a planar surface region of the second connection element 105. The first region 104.1 of the first connection element 104 and the second region 105.1 of the second connection element 105 are situated opposite to each other and the distance between them is smaller than 100 μm.

The feature according to which the distance between the first region 104.1 and the second region 105.1 is smaller than 100 μm covers all incremental values descending from 100 μm, wherein the increment can be, for example, 1 μm or 1 nm.

According to one embodiment illustrated in FIG. 1, an insulation layer can be provided between the first region 104.1 and the second region 105.1. The insulation layer can be made of any electrically insulating material and can be applied by a suitable technique. The insulation layer can, for example, be made of a dielectric foil or tape and it can, for example, be laminated or adhered to one or both of the surfaces of the first region 104.1 or the second region 105.1. In one embodiment, the insulation layer can occupy the whole space between the first and second regions 104.1 and 105.1.

According to one embodiment illustrated in FIG. 1, a backside of at least one of the first transistor 102 and the second transistor 103, in one embodiment a contact area on the respective backside, is electrically connected to the carrier 101.

According to one embodiment, at least one of the first transistor 102 and the second transistor 103 is a vertical transistor, in one embodiment an IGB (insulated gate bipolar) transistor.

According to one embodiment illustrated in FIG. 1, at least one of the first transistor 102 and the second transistor 103 is a power transistor.

According to one embodiment illustrated in FIG. 1, the first transistor 102 is electrically connected to the second transistor 103. In one embodiment, the second connection element 105 can be arranged so that it connects the first transistor 102 to the second transistor 103. More specifically, the second connection element 105 can be connected with one end to a contact pad on the front side of the second transistor 103 and with another end to a contact pad on the carrier 101 and the carrier contact pad can be connected to a contact pad on the backside of the first transistor 102.

According to one embodiment illustrated in FIG. 1, the first connection element 104 electrically connects the first transistor 102 to a ground potential terminal. In one embodiment, one end of the first connection element 104 may be connected to a contact pad on the carrier 101 which contact pad is connected to the ground potential terminal, and another end of the first connection element 104 may be connected to a contact pad on a front side surface of the first transistor 102.

According to one embodiment illustrated in FIG. 1, in operation of the electronic module 100 electrical currents are flowing through the first connection element 104 and the second connection element 105 wherein the currents are flowing in opposite directions.

According to one embodiment illustrated in FIG. 1, a third connection element is provided, the third connection element connecting the first transistor 102 to the carrier 101. In one embodiment, the third connection element may connect the first transistor to a contact pad on the carrier 101, the contact pad being connected to a ground potential terminal.

In the electronic module illustrated in FIG. 1, parasitic inductivities of the connection elements 104 and 105 may compensate each other at least in part. The first connection element 104 may in addition compensate for a parasitic inductivity of a contact pad on the carrier 101 connecting the second connection element 105 with a backside contact pad of the first transistor 102. Moreover, the first connection element 104 may be able to efficiently dissipate the heat which may develop during operation of the first and second transistors 102 and 103.

Figure 2:
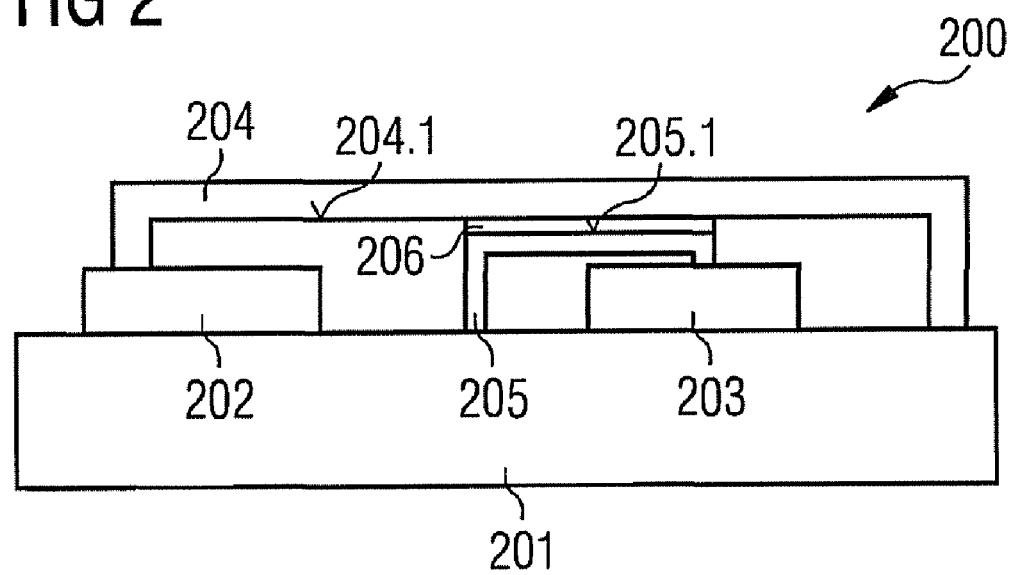
FIG. 2 illustrates a sectional side view of an electronic module according to one embodiment.

FIG. 2 illustrates a sectional side view of one embodiment of an electronic module 200. The electronic module 200 includes a carrier 201, a first transistor 202 attached to the carrier 201, a second transistor 203 attached to the carrier 201, a first connection element 204 including a first planar region 204.1, and a second connection element 205 including a second planar region 205.1. The first connection element 204 electrically connects the first transistor 202 to the carrier 201, and the second connection element 205 electrically connects the second transistor 203 to the carrier 201. An insulation layer 206 is provided between the first region 204.1 and the second region 205.1.

In the embodiment illustrated in FIG. 2, the first region 204.1 of the first connection element 204 is given as a planar surface region of the first connection element 204 and the second region 205.1 of the second connection element 205 is given as a planar surface region of the second connection element 205. The first region 204.1 of the first connection element 204 and the second region 205.1 of the second connection element 205 are situated opposite to each other.

According to one embodiment illustrated in FIG. 2, the distance between the first region 204.1 and the second region 205.1 is smaller than 100 µm. The feature according to which the distance between the first region 204.1 and the second region 205.1 is smaller than 100 µm covers all incremental values descending from 100 µm, wherein the increment can be, for example, 1 µm or 1 nm.

The insulation layer 206 can be made of any electrically insulating material and can be applied by a suitable technique. The insulation layer 206 can, for example, be made of a dielectric foil or tape and it can, for example, be laminated or adhered to one or both of the surfaces of the first region 204.1 or the second region 205.1.

According to one embodiment illustrated in FIG. 2, a backside of at least one of the first transistor 202 and the second transistor 203 is electrically connected to the carrier 201.

According to one embodiment illustrated in FIG. 2, at least one of the first transistor 202 and the second transistor 203 is a vertical transistor, in one embodiment an IGB (insulated gate bipolar) transistor.

According to one embodiment illustrated in FIG. 2, at least one of the first transistor 202 and the second transistor 203 is a power transistor.

According to one embodiment illustrated in FIG. 2, the first transistor 202 is electrically connected to the second transistor 203. In one embodiment, the second connection element 205 can be arranged so that it connects the first transistor 202 to the second transistor 203. More specifically, the second connection element 205 can be connected with one end to a contact pad on the front side of the second transistor 103 and with another end to a contact pad on the carrier 201 and the carrier contact pad can be connected to a contact pad on the backside of the first transistor 202.

According to one embodiment illustrated in FIG. 2, the first connection element 204 electrically connects the first transistor 202 to a ground potential terminal. In one embodiment, one end of the first connection element 204 may be connected to a contact pad on the carrier 201 which contact pad is connected to the ground potential terminal, and another end of the first connection element 204 may be connected to a contact pad on a front side surface of the first transistor 202.

According to one embodiment illustrated in FIG. 2, in operation of the electronic module 200 electrical currents are flowing through the first connection element 204 and the second connection element 205 wherein the currents are flowing in opposite directions.

According to one embodiment illustrated in FIG. 2, a third connection element is provided, the third connection element connecting the first transistor 202 to the carrier 201. In one embodiment, the third connection element may connect the first transistor to a contact pad on the carrier 201, the contact pad being connected to a ground potential terminal.

In the electronic module illustrated in FIG. 2, parasitic inductivities of the connection elements 204 and 205 may compensate each other at least in part. The first connection element 204 may in addition compensate for a parasitic inductivity of a contact pad on the carrier 201 connecting the second connection element 205 with a backside contact pad of the first transistor 202. Moreover, the first connection element 204 may be able to efficiently dissipate the heat which may develop during operation of the first and second transistors 202 and 203.

Figure 3:
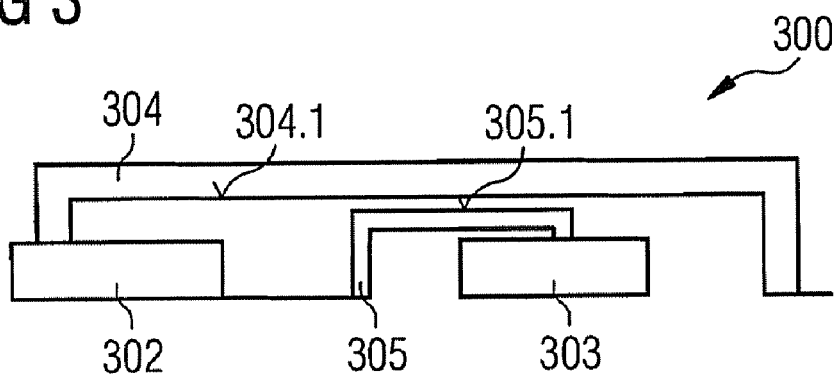
FIG. 3 illustrates a sectional side view of an electronic module according to one embodiment.

FIG. 3 illustrates a sectional side view of one embodiment of an electronic module 300. The electronic module 300 includes a first transistor 302, a second transistor 303, a first connection element 304 including a first planar region 304.1, and a second connection element 305 including a second planar region 305.1. The first connection element 304 electrically connects the first transistor 302 to a ground potential terminal, and the second connection element 305 electrically connects the second transistor 303 to the first transistor 302. The distance between the first region 304.1 and the second region 305.1 is smaller than 100 µm.

In the embodiment illustrated in FIG. 3 the first region 304.1 of the first connection element 304 is given as a planar surface region of the first connection element 304 and the second region 305.1 of the second connection element 305 is given as a planar surface region of the second connection element 305. The first region 304.1 of the first connection element 304 and the second region 305.1 of the second connection element 305 are situated opposite to each other and the distance between them is smaller than 100 µm.

The feature according to which the distance between the first region 304.1 and the second region 305.1 is smaller than 100 µm covers all incremental values descending from 100 µm, wherein the increment can be, for example, 1 µm or 1 nm.

According to one embodiment illustrated in FIG. 3, an insulation layer can be provided between the first region 304.1 and the second region 305.1. The insulation layer can be made of any electrically insulating material and can be applied by any conventional technique. The insulation layer can, for example, be made of a dielectric foil or tape and it can, for example, be laminated or adhered to one or both of the surfaces of the first region 304.1 or the second region 305.1. In one embodiment, the insulation layer can occupy the whole space between the first and second regions 304.1 and 305.1.

According to one embodiment illustrated in FIG. 3, at least one of the first transistor 302 and the second transistor 303 is a vertical transistor, in one embodiment an IGB (insulated gate bipolar) transistor.

According to one embodiment illustrated in FIG. 3, at least one of the first transistor 302 and the second transistor 303 is a power transistor.

According to one embodiment illustrated in FIG. 3, the electronic module 300 can further include a carrier and the first connection element 304 can be connected to a contact pad on the carrier and the carrier contact pad is connected to a contact pad on the backside of the first transistor 302, and the first connection element 304 is connected with a contact pad on the front side of the second transistor 303.

According to one embodiment illustrated in FIG. 3, the electronic module 300 can further include a carrier and one end of the second connection element 305 may be connected to a contact pad on the carrier which carrier contact pad is connected to the ground potential terminal, and another end of the second connection element 305 may be connected to a contact pad on a front side surface of the first transistor 302.

According to one embodiment illustrated in FIG. 3, in operation of the electronic module 300 electrical currents are flowing through the first connection element 304 and the second connection element 305 wherein the currents are flowing in opposite directions.

According to one embodiment illustrated in FIG. 3, a carrier and a third connection element is provided, the third connection element connecting the first transistor 302 to the carrier. In one embodiment, the third connection element may connect the first transistor to a contact pad on the carrier, the contact pad being connected to a ground potential terminal.

In the electronic module illustrated in FIG. 3, parasitic inductivities of the connection elements 304 and 305 may compensate each other at least in part. The first connection element 304 may in addition compensate for a parasitic inductivity of a contact pad connecting the second connection element 305 with a backside contact pad of the first transistor 302. Moreover, the first connection element 304 may be able to efficiently dissipate the heat which may develop during operation of the first and second transistors 302 and 303.

Figure 4:
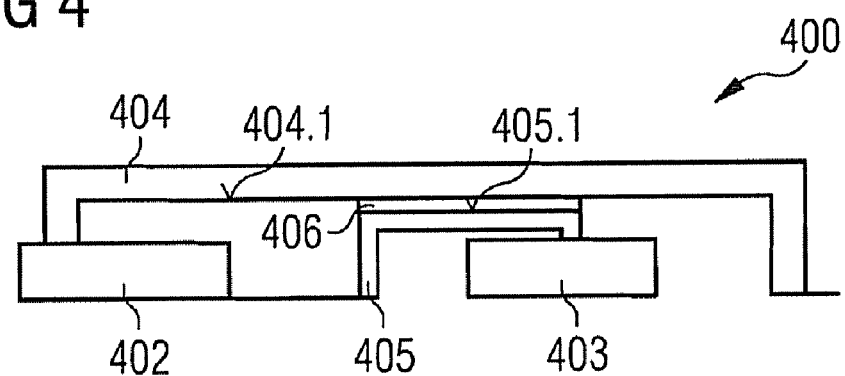
FIG. 4 illustrates a sectional side view of an electronic module according to one embodiment.

FIG. 4 illustrates a sectional side view of a fourth embodiment of an electronic module 400. The electronic module 400 includes a first transistor 402, a second transistor 403, a first connection element 404 including a first region 404.1, and a second connection element 405 including a second region 405.1. The first connection element 404 electrically connects the first transistor 402 to a ground potential terminal, and the second connection element 405 electrically connects the second transistor 403 to the first transistor 402. An insulation layer 406 is provided between the first region 404.1 and the second region 405.1.

In the embodiment illustrated in FIG. 4, the first region 404.1 of the first connection element 404 is given as a planar surface region of the first connection element 404 and the second region 405.1 of the second connection element 405 is given as a planar surface region of the second connection element 405. The first region 404.1 of the first connection element 404 and the second region 405.1 of the second connection element 405 are situated opposite to each other. An insulation layer 406 is provided between the first region 404.1 and the second region 405.1.

According to one embodiment illustrated in FIG. 4, the distance between the first region 404.1 and the second region 405.1 is smaller than 100 µm. The feature according to which the distance between the first region 404.1 and the second region 405.1 is smaller than 100 µm covers all incremental values descending from 100 µm, wherein the increment can be, for example, 1 µm or 1 nm.

The insulation layer 406 can be made of any electrically insulating material and can be applied by any conventional technique. The insulation layer 406 can, for example, be made of a dielectric foil or tape and it can, for example, be laminated or adhered to one or both of the surfaces of the first region 404.1 or the second region 405.1. In one embodiment, the insulation layer 406 can occupy the whole space between the first and second regions 404.1 and 405.1.

According to one embodiment illustrated in FIG. 4, at least one of the first transistor 402 and the second transistor 403 is a vertical transistor, in one embodiment an IGB (insulated gate bipolar) transistor.

According to one embodiment illustrated in FIG. 4, at least one of the first transistor 402 and the second transistor 403 is a power transistor.

According to one embodiment illustrated in FIG. 4, the electronic module 400 can further include a carrier and the first connection element 404 can be connected to a contact pad on the carrier and the carrier contact pad is connected to a contact pad on the backside of the first transistor 402, and the first connection element 404 is connected with a contact pad on the front side of the second transistor 403.

According to one embodiment illustrated in FIG. 4, the electronic module 400 can further include a carrier and one end of the second connection element 405 may be connected to a contact pad on the carrier which carrier contact pad is connected to the ground potential terminal, and another end of the second connection element 405 may be connected to a contact pad on a front side surface of the first transistor 402.

According to one embodiment illustrated in FIG. 4, in operation of the electronic module 400 electrical currents are flowing through the first connection element 404 and the second connection element 405 wherein the currents are flowing in opposite directions.

According to one embodiment illustrated in FIG. 4, a carrier and a third connection element is provided, the third connection element connecting the first transistor 402 to the carrier. In one embodiment, the third connection element may connect the first transistor to a contact pad on the carrier, the contact pad being connected to a ground potential terminal.

In the electronic module of the embodiment as illustrated in FIG. 4, parasitic inductivities of the connection elements 404 and 405 may compensate each other at least in part. The first connection element 404 may in addition compensate for a parasitic inductivity of a contact pad connecting the second connection element 405 with a backside contact pad of the first transistor 402. Moreover, the first connection element 404 may be able to efficiently dissipate the heat which may develop during operation of the first and second transistors 402 and 403.

Figure 5:
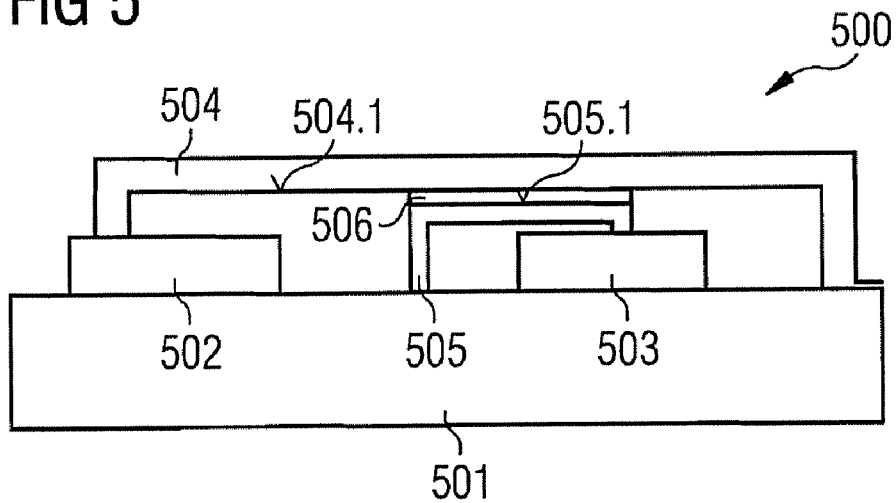
FIG. 5 illustrates a sectional side view of an electronic module according to one embodiment.

FIG. 5 illustrates a sectional side view of a fifth embodiment of an electronic module 500. The electronic module 500 includes a carrier 501, a first transistor 502 attached to the carrier 501, a second transistor 503 attached to the carrier 501, a first connection element 504 including a first region 504.1, and a second connection element 505 including a second region 505.1. The first connection element 504 electrically connects the first transistor 502 to the carrier 501, and the second connection element 505 electrically connects the second transistor 503 to the carrier 501. The distance between the first region 504.1 and the second region 505.1 is smaller than 100 μm.

In one embodiment illustrated in FIG. 5 the first region 504.1 of the first connection element 504 is given as a planar surface region of the first connection element 504 and the second region 505.1 of the second connection element 505 is given as a planar surface region of the second connection element 505. The first region 504.1 of the first connection element 504 and the second region 505.1 of the second connection element 505 are situated opposite to each other and the distance between them is smaller than 100 μm.

The feature according to which the distance between the first region 504.1 and the second region 505.1 is smaller than 100 μm covers all incremental values descending from 100 μm, wherein the increment can be, for example, 1 μm or 1 nm.

An insulation layer 506 is provided between the first region 504.1 and the second region 505.1. The insulation layer 506 can be made of any electrically insulating material and can be applied by a suitable technique. The insulation layer can, for example, be made of a dielectric foil or tape and it can, for example, be laminated or adhered to one or both of the surfaces of the first region 504.1 or the second region 505.1.

According to one embodiment illustrated in FIG. 5, a backside of at least one of the first transistor 502 and the second transistor 503 is electrically connected to the carrier 501.

According to one embodiment illustrated in FIG. 5, at least one of the first transistor 502 and the second transistor 503 is a vertical transistor, in one embodiment an IGB (insulated gate bipolar) transistor.

According to one embodiment illustrated in FIG. 5, at least one of the first transistor 502 and the second transistor 503 is a power transistor.

According to one embodiment illustrated in FIG. 5, the first transistor 502 is electrically connected to the second transistor 503. In one embodiment, the first connection element 504 can be arranged so that it connects the first transistor 502 to the second transistor 503. More specifically, the first connection element 504 can be connected to a contact pad on the carrier 501 and the carrier contact pad is connected to a contact pad on the backside of the first transistor 502, and the first connection element 504 is connected with a contact pad on the front side of the second transistor 503.

According to one embodiment illustrated in FIG. 5, the first connection element 505 electrically connects the first transistor 502 to a ground potential terminal. In one embodiment, one end of the second connection element 505 may be connected to a contact pad on the carrier 501 which carrier contact pad is connected to the ground potential terminal, and another end of the second connection element 505 may be connected to a contact pad on a front side surface of the first transistor 502.

According to one embodiment illustrated in FIG. 5, in operation of the electronic module electrical currents are flowing through the first connection element 504 and the second connection element 505 wherein the currents are flowing in opposite directions.

According to one embodiment illustrated in FIG. 5, a third connection element is provided, the third connection element connecting the first transistor 502 to the carrier 501. In one embodiment, the third connection element may connect the first transistor to a contact pad on the carrier 501, the contact pad being connected to a ground potential terminal.

In the electronic module of the embodiment illustrated in FIG. 5, parasitic inductivities of the connection elements 504 and 505 may compensate each other at least in part. The first connection element 504 may in addition compensate for a parasitic inductivity of a contact pad on the carrier 501 connecting the second connection element 505 with a backside contact pad of the first transistor 502. Moreover, the first connection element 504 may be able to efficiently dissipate the heat which may develop during operation of the first and second transistors 502 and 503.

According to one embodiment, the electronic module may include one or more of a power transistor module, a half-bridge module, a DC-DC converter, an AC-DC converter and a DC-AC converter.

Figure 6A:
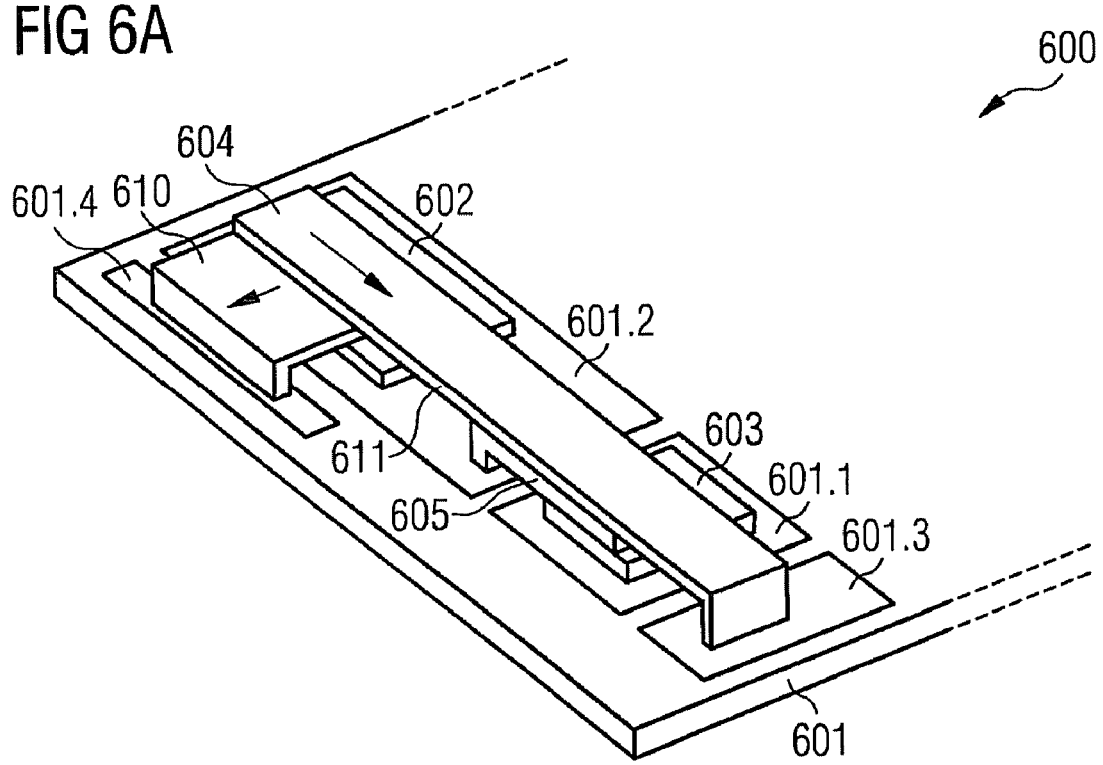
FIG. 6A-C illustrates a perspective view of an electronic module according to one embodiment.
Figure 6B:
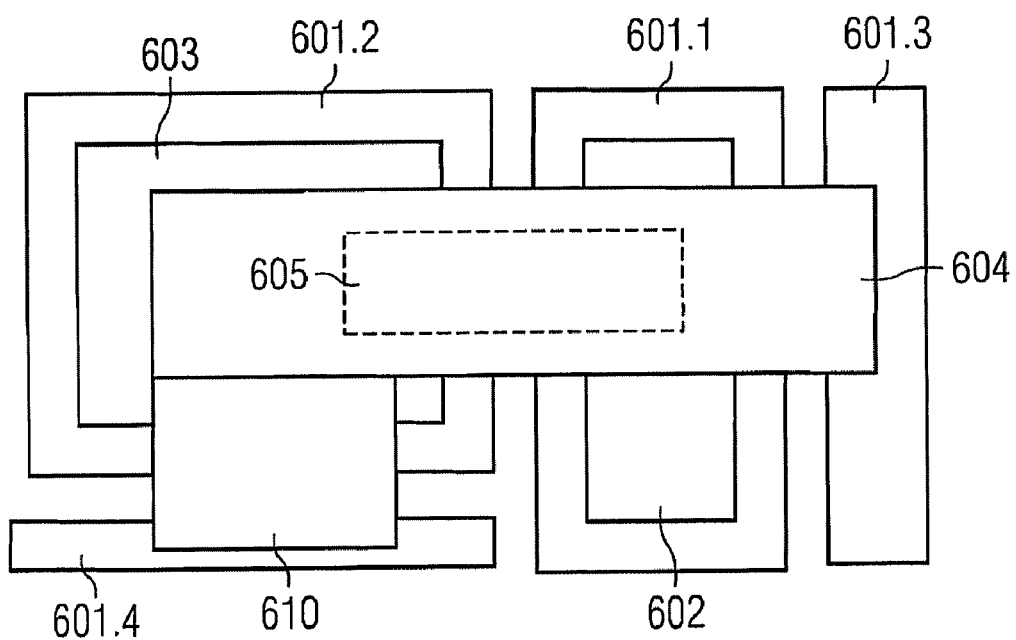
Figure 6C:
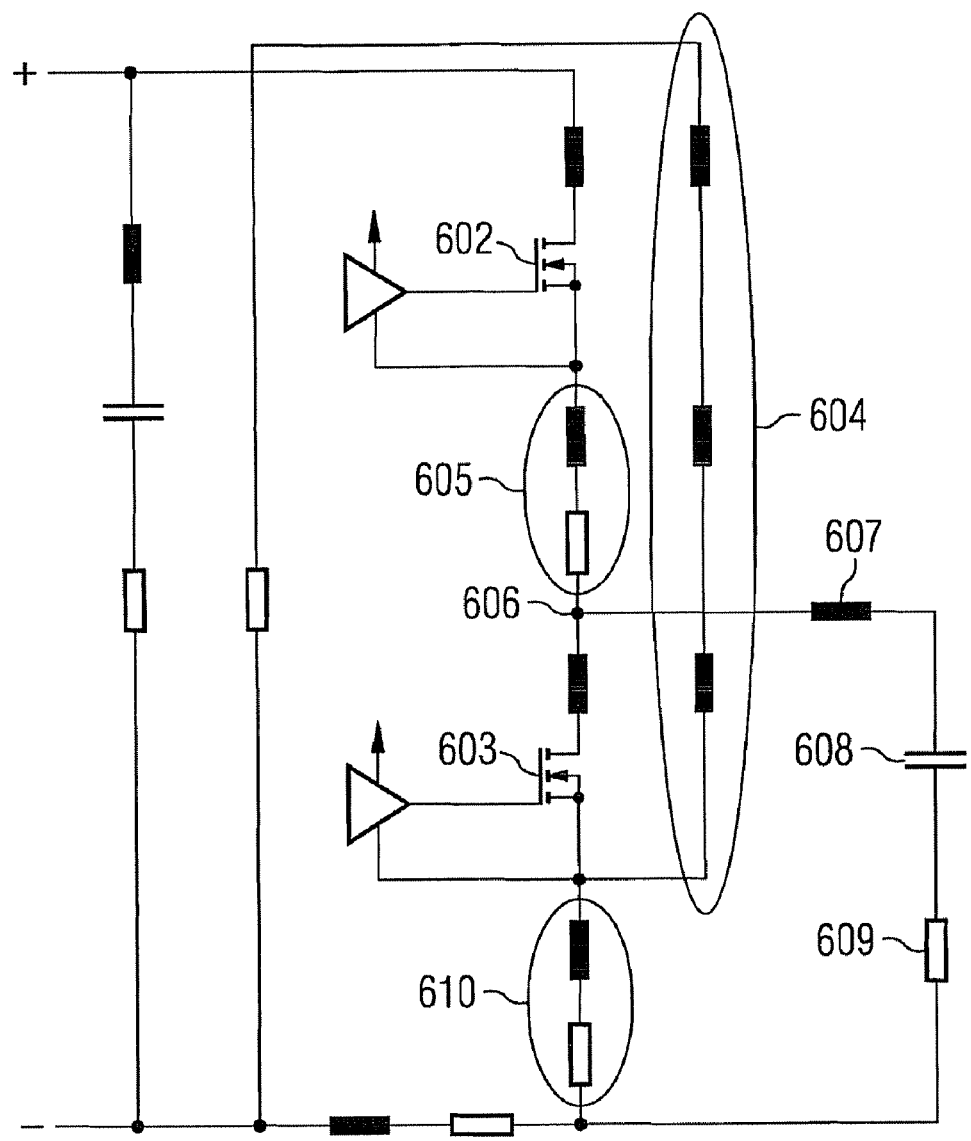

FIG. 6A-C relates to a further embodiment of an electronic module. FIG. 6A illustrates a perspective view of the electronic module 600 whereas FIG. 6B illustrates a top view of the electronic module 600 and FIG. 6C illustrates an equivalent circuit of the electronic module 600 and further circuit components.

The electronic module 600 as illustrated in the equivalent circuit of FIG. 6C is configured as a DC-DC converter including a half-bridge circuit. The half-bridge circuit contains a first transistor 602 and a second transistor 603 which are switched sequentially between a positive potential and a negative potential of an input voltage. Therein the first transistor 602 is connected to the positive potential and the second transistor 603 is connected to the negative potential. In a connection line between the first transistor 602 and the second transistor 603 a node 606 is provided, the node 606 being connected with an inductor 607, the inductor 607 being connected to a capacitor 608, the capacitor 608 being connected to a resistor 609. The negative potential of the input voltage is at the same time the negative potential of the output voltage which is also connected to the resistor 609. The positive potential of the output voltage is tapped at a node between the inductor 607 and the capacitor 608.

The first transistor 602 and the second transistor 603 are switched on and off by a pulse width modulation (PWM) scheme. As a result a voltage develops at the node 606 which varies due to the on and off switching events. These variations are filtered to a great extent by the inductor 607 and the capacitor 608 so that the output voltage is substantially a constant voltage.

The carrier 601 includes contact pads 601.1, 601.2, 601.3 and 601.4 applied thereon. The transistors 602 and 603 are formed as vertical transistors, respectively, having their respective drain electrodes on their respective backside surfaces, wherein the second transistor 603 is applied with its backside surface to a first contact pad 601.1 and the first transistor 602 is applied with its backside surface to a second contact pad 601.2. The transistors 602 and 603 include front side surfaces whereon respective source electrodes and gate electrodes are provided. The source electrode of the second transistor 603 is connected by a second connection element 605 to the second contact pad 601.2 which is electrically connected to the drain electrode of the first transistor 602. The source electrode of the first transistor 602 is connected by a first connection element 604 to a third contact pad 601.3 which is connected to a ground potential terminal. In addition, the source electrode of the first transistor 602 is connected by a third connection element 610 to a fourth contact pad 601.4 which is as well connected to a ground potential terminal.

The first connection element 604 and the second connection element 605 are separated from each other by a thin insulation layer 611. The insulation layer 611 can be a thin foil which can be laminated, for example, onto the upper surface of the second connection element 605 and can be made as thin as possible, i.e. as thin so that the first and second connection elements 604 and 605 are still electrically isolated from each other and no currents like, for example, tunnel currents or leakage currents flow between them. In operation of the electronic module 600 the currents flowing through the first and second connection elements 604 and 605 are flowing in opposite directions so that the parasitic inductivity of the second connection element 605 can be compensated by a particular section of the first connection element 604 lying opposite to the horizontal section of the second connection element 605 and separated from it by the insulation layer 611. This situation is illustrated schematically in the equivalent circuit of FIG. 6C. The parasitic inductivities of the circuit are symbolized by short full rectangles and resistivities are illustrated by short open rectangles. The main parasitic inductivities are located in the electrical connections from and to the transistors 602 and 603. These parasitic inductivities can be compensated to a greater or lesser extent by the inductivities of the first connection element 604 which is indicated as an oval drawn around three inductivities each of which is intended to at least partly compensate a parasitic inductivity of an electrical line to or from one of the transistors 602 and 603. In one embodiment, the parasitic inductivity of the second connection element 605, which is also indicated as an oval in FIG. 6C, is expected to be efficiently compensated by the inductivity of the respective portion of the first connection element 604 which was already explained in connection with FIG. 6A.

The inductor 607, the capacitor 608 and the resistor 609 of the equivalent circuit in FIG. 6C are not illustrated in FIG. 6A. These electrical devices can be located somewhere else like, for example, as electrical devices embedded in the carrier 601 which can be, for example, a printed circuit board. Also not illustrated in FIG. 6A-C is the driver circuit which is connected with the gate terminals of the transistors 602 and 603 and which provides the PWM modulation frequency to the transistors 602 and 603.

The PWM frequency with which the transistors 602 and 603 are controlled can be in the range 200 kHz to 2 MHz. As illustrated in FIGS. 6A and 6C, the source terminal of the first transistor 602 is connected by the first connection element 604, namely a long and narrow connection element to the ground-connected third contact pad 601.3 and the source terminal of the first transistor 602 is connected with the third connection element 610, namely with a short and wide connection element to the ground-connected fourth contact pad 601.4. This means that in dependence on the switching frequency different portions of the current are flowing over the first connection element 604 and the third connection element 610 to the ground terminals. The third connection element 610 is formed short and wide and includes therefore a relatively low DC resistance whereas the first connection element 604 is formed narrow and long and includes therefore a relatively large DC resistance. This means that at rather low switching frequencies a greater portion of the current flows over the third connection element 610 as compared to the current flowing over the first connection element 604, and with increasing switching frequency an increasing portion of the current will flow over the first connection element 604.

As described above, the first connection element 604 serves for compensating the parasitic inductivity of the second connection element 605 and also to some extent of the parasitic inductivities of further electrical connection lines like, for example, contact pads and transistor load paths. The first connection element 604 is positioned above both of the first and second transistors 602 and 603 and thus may serve for an efficient dissipation of the heat generated by the two transistors. The two transistors are applied to contact pads of the carrier 601 so that the heat can also be conducted away by the carrier 601 and carrier 601 and the additional first connection element 604 above the two transistors serve for an efficient double side cooling of the electronic module 600. This will also help to improve the conversion efficiency of the DC-DC converter and the electromagnetic safety and reliability.

The electrical connection elements 604, 605 and 610 can be applied, for example, by a printing technique. That is, after mounting the first and second transistors 602 and 603 onto the respective contact pads 601.1 and 601.2, the electrical connection elements 604, 605 and 610 are printed onto the front side surfaces of the transistors and the contact pads 601.3 and 601.4 in an appropriate sequence. A soldering layer can be applied between the first connection element 604 and the third connection element 610. Thereafter a mold material can be applied onto the assembly consisting of first and second transistors and electrical connection elements. The mold material can be applied such that the first connection element 604 or an upper surface thereof is exposed or visible to the outside.

Figure 7:
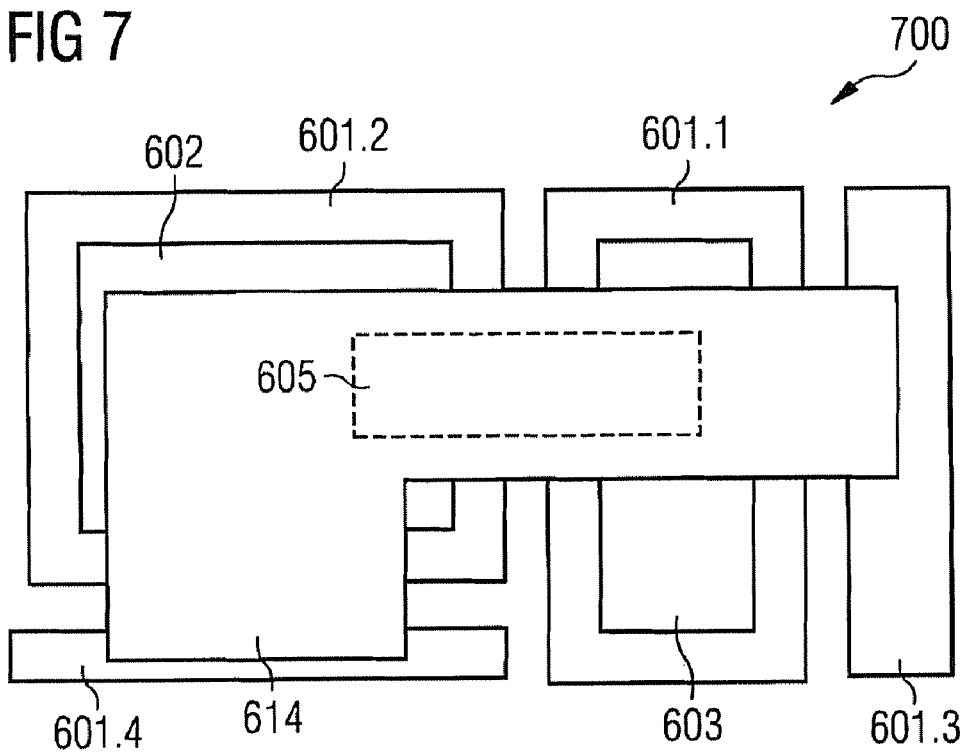
FIG. 7 illustrates a top view of an electronic module according to one embodiment.

In FIG. 7 a top view of one embodiment of an electronic module is illustrated. The electronic module 700 as illustrated in FIG. 7A is a modification of the electronic module as illustrated in FIG. 6A-C, in one embodiment 6B. Elements having same or similar function have been given same reference numbers. In one embodiment, the first connection element 604 and the third connection element 610 of the embodiment of FIG. 6B have been combined into one single (first) connection element 614 of the electronic module 700. The first electronic element 614 has roughly the shape of the letter "L" wherein the lower portion of the L is formed as a short and wide bar being connected to the fourth contact pad 601.4 and a long portion of the L is formed as a long narrow bar being connected to the third contact pad 601.3.

Figure 8:
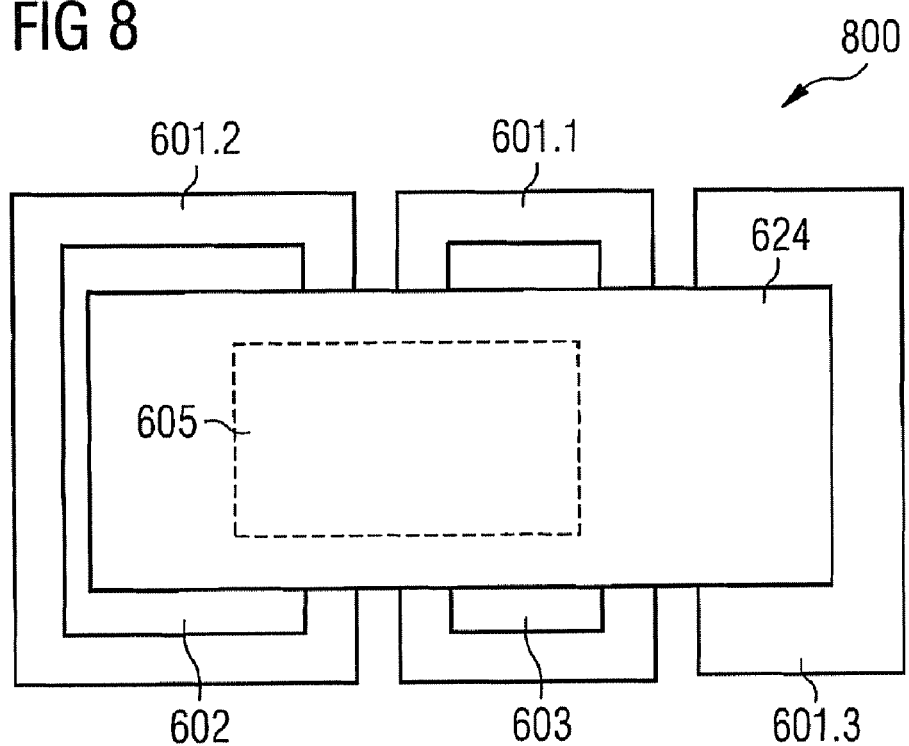
FIG. 8 illustrates a top view of an electronic module according to one embodiment.

FIG. 8 illustrates a top view of one embodiment of an electronic module. The electronic module 800 as compared with the electronic module 600 of FIG. 6B includes a first connection element 624 connecting the first transistor 602 with the third contact pad 601.3. One modification with respect to the electronic module 600 of FIG. 6B is due to the fact that the third connection element 610 is omitted and that also the fourth contact pad 601.4 is omitted. As explained above in connection with FIGS. 6A-C, the partial current flowing over the third connection element 610 is strong if low switching frequencies are applied due to the low DC resistance of the third switching element 610. The third connection element 610 can thus be omitted as there is provided the first connection element connecting the source terminal of the first transistor 602 with the ground-connected contact pad 601.3. In general there is no absolute necessity for providing the third connection element 610, in one embodiment if high switching frequencies are applied to the transistors 602 and 603 as in this case the dominating portion anyway flows over the first connection element 624.

Figure 9:
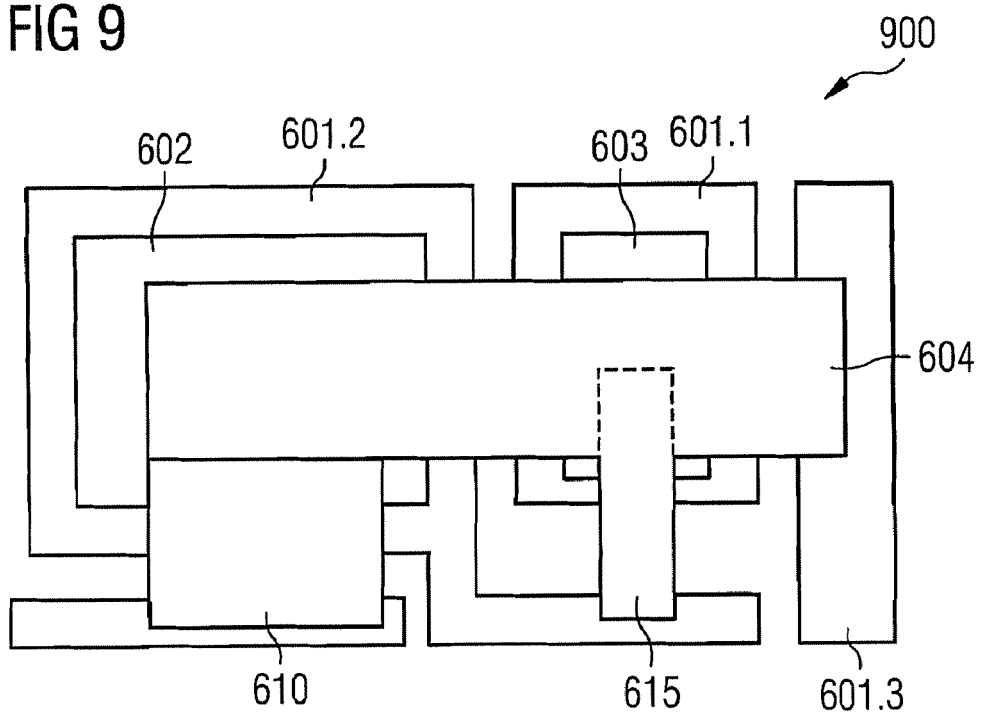
FIG. 9 illustrates a top view of an electronic module according to one embodiment.

FIG. 9 illustrates a top view of one embodiment of an electronic module. The electronic module 900 is similar to the electronic module 600 as illustrated in FIGS. 6A-C and in the following the modifications of the electronic module 900 are outlined as compared to FIG. 6B. One modification is the modified way of connecting the two transistors 602 and 603. The first contact pad 601.2 is amended in that an extended portion is applied thereto and the first connection element 614 (corresponding to element 605 in FIG. 6B) is connected with the extended portion of the second contact pad 601.2. The extended portion of the second contact pad 601.2 extends below the first contact pad 601.1 and the second connection element 615 is arranged below the first connection element 604 and contacted with one end thereof with the source terminal of the first transistor 602 and with the other end thereof with the extended portion of the second contact pad 601.2.

Figure 10:
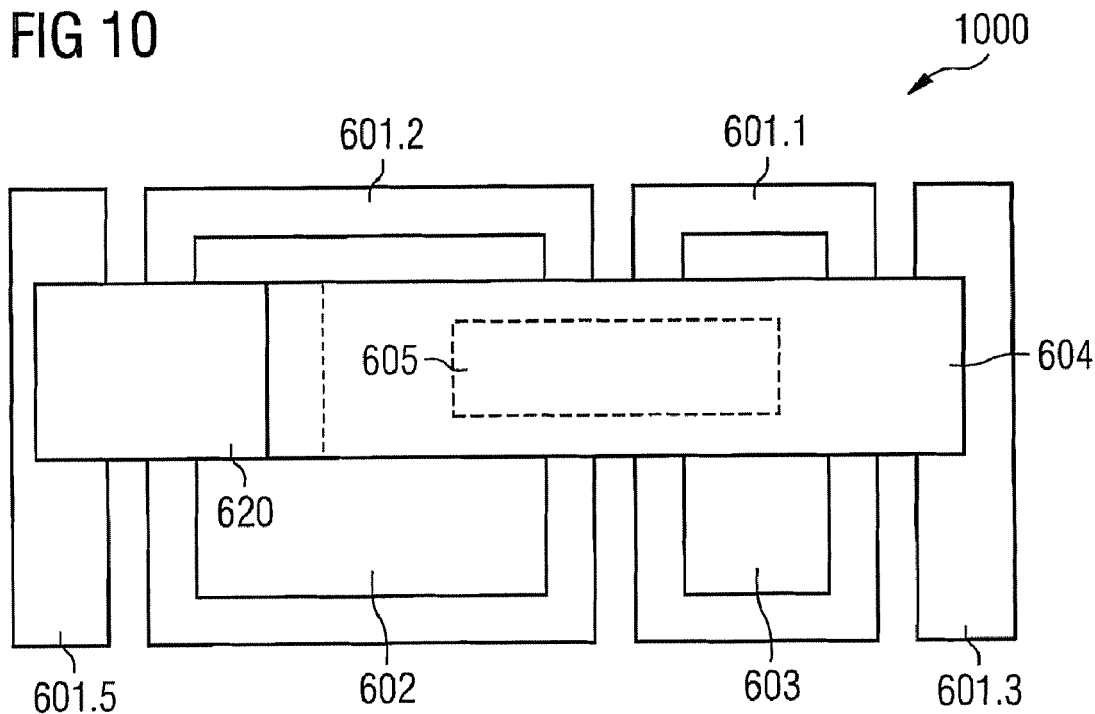
FIG. 10 illustrates a perspective view of an electronic module according to one embodiment.

FIG. 10 illustrates a top view of one embodiment of an electronic module. The electronic module 1000 is similar to the electronic module 600 as illustrated in FIG. 6A-C and the modifications of the electronic module 1000 are outlined in the following. One modification is that the fourth contact pad 601.5 is located on the left side of the second contact pad 601.2 so that the third connection element 620, which is to be compared with the third connection element 610 of FIG. 6B, now extends in the horizontal direction from the source terminal of the second transistor 603 below the first connection element 604 to the fourth contact pad 601.5.

Figure 11:
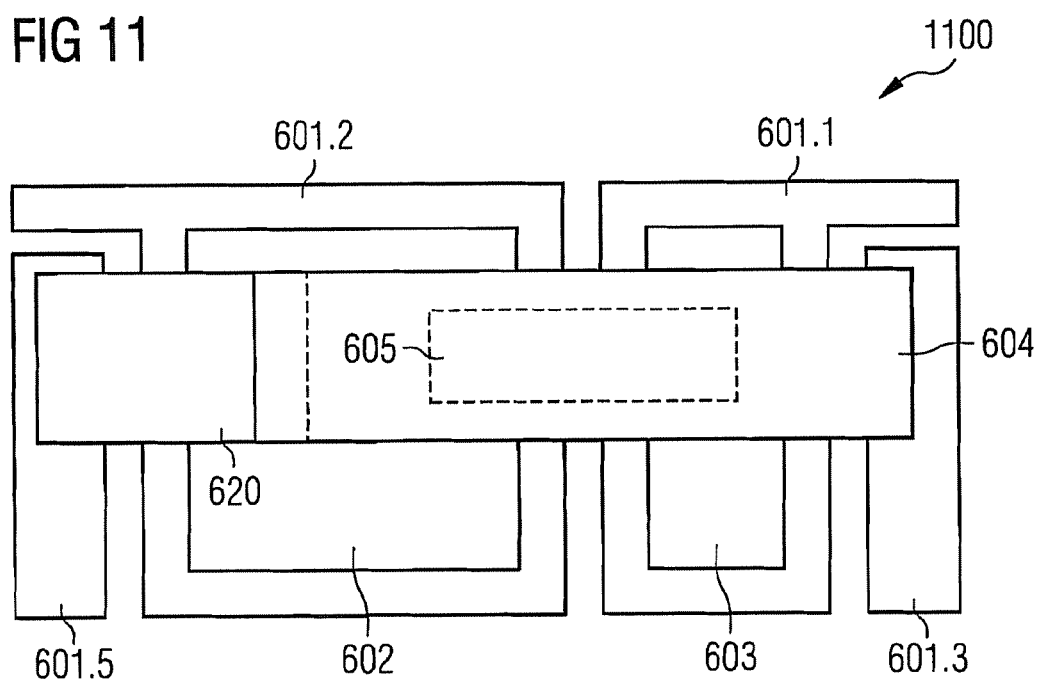
FIG. 11 illustrates a top view of an electronic module according to one embodiment.

FIG. 11 illustrates a top view of one embodiment of an electronic module. The electronic module 1100 is similar to the electronic module 1000 as explained in connection with FIG. 10 and the modifications of the electronic module 1100 are explained in the following. One modification is that extended portions are applied to the first contact pad 601.1 and the second contact pad 601.2 so that the first and second contact pads now extend to the left and right edges of the electronic module. With this embodiment, it is easier to extend the power section of the electronic module 1100 so that higher power ranges can be achieved. For example, it is easier with the electronic module 1100 of FIG. 11 to add one more half-bridge to the existing half-bridge by, for example, connecting it at the extended portions of the contact pads 601.1 and 601.2.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic module comprising:
a first transistor;
a second transistor;
a first connection element comprising a first region, the first connection element directly electrically connecting the first transistor to a ground potential terminal; and
a second connection element comprising a second region, the second connection element connecting the second transistor to the first transistor,
wherein an insulation layer is provided between the first region and the second region, and
wherein the distance between the first region and the second region is smaller than 100 μm.

2. The electronic module of claim 1, wherein at least one of the first transistor and the second transistor is a power transistor.

3. The electronic module of claim 1, further comprising:
a carrier; and
the second transistor being attached to the carrier.

4. The electronic module of claim 1, further comprising:
a carrier; and
the first transistor being attached to the carrier.

5. The electronic module of claim 1, comprising wherein at least one of the first transistor and the second transistor is covered with molding material.

6. The electronic module of claim 1, comprising wherein at least one of the first connection means and the second connection means is exposed to the outside.

7. The electronic module of claim 3, wherein the second connection element electrically connects the second transistor to the carrier.

8. The electronic module of claim 4, wherein the first connection element electrically connects the first transistor to the carrier.

9. The electronic module of claim 1, wherein the first connection element is configured such that electrical currents flow in a first direction and the second connection element is configured such that electrical currents flow in a second direction opposite the first direction.

10. The electronic module of claim 1, wherein the first and second connection elements are configured to compensate parasitic inductivities of each other.

11. The electronic module of claim 4, wherein the first connection element is configured to compensate for a parasitic inductivity of a contact pad on the carrier connecting the second connection element with a backside contact pad of the first transistor.

12. The electronic module of claim 1, wherein the first connection element comprises a planar surface region and the second connection element comprises a planar surface region.

13. The electronic module of claim 1, wherein the first connection element is positioned above both the first and second transistors.

14. The electronic module of claim 1, wherein the first connection element is configured to dissipate operational heat of the first and second transistors.

15. An electronic module, comprising:
a first transistor;
a second transistor;
a first connection element comprising a first planar region, the first connection element directly electrically connecting the first transistor to the second transistor; and
a second connection element comprising a second planar region, the second connection element electrically connecting the second transistor to a ground potential terminal,
wherein a distance between the first planar region and the second planar region is smaller than 100 μm.

16. The electronic module of claim 15, further comprising:
an insulation layer between the first region and the second region.

17. The electronic module of claim 15, comprising wherein at least one of the first transistor and the second transistor is a power transistor.

18. The electronic module of claim 15, further comprising:
a carrier, wherein the second transistor is attached to the carrier.

19. The electronic module of claim 15, wherein the first and second connection elements are configured to compensate parasitic inductivities of each other.

20. The electronic module of claim 19, wherein the first connection element is configured such that electrical currents flow in a first direction and the second connection element is configured such that electrical currents flow in a second direction opposite the first direction.

* * * * *